United States Patent [19]

Sugiura et al.

[11] Patent Number: 4,791,474
[45] Date of Patent: Dec. 13, 1988

[54] SEMICONDUCTOR INTEGRATED CIRCUIT DEVICE

[75] Inventors: Yoshihide Sugiura, Tokyo; Hiroaki Ichikawa, Yokohama; Nobutake Matsumura; Nobuo Sasaki, both of Kawasaki, all of Japan

[73] Assignee: Fujitsu Limited, Kawasaki, Japan

[21] Appl. No.: 131,323

[22] Filed: Dec. 8, 1987

Related U.S. Application Data

[63] Continuation of Ser. No. 861,638, May 7, 1986, abandoned, which is a continuation of Ser. No. 780,243, Sep. 26, 1985, abandoned, which is a continuation of Ser. No. 683,954, Dec. 19, 1984, abandoned, which is a continuation of Ser. No. 174,139, Jul. 31, 1980, abandoned.

[30] Foreign Application Priority Data

Jul. 31, 1979 [JP] Japan .................................. 54-97623

[51] Int. Cl.4 ............................................. H01L 27/04
[52] U.S. Cl. ......................................... 357/71; 357/40; 357/45
[58] Field of Search .................. 357/40, 45, 59, 68, 357/70, 71

[56] References Cited

U.S. PATENT DOCUMENTS 4,197,555  4/1980  Uehara et al. ..................... 357/71
4,412,237 10/1983  Matsumura et al. ............... 357/45

FOREIGN PATENT DOCUMENTS 00461  7/1979  Japan ................................. 357/45
0082448  6/1980  Japan ................................. 372/45

Primary Examiner—James W. Davie
Attorney, Agent, or Firm—Staas & Halsey

[57] ABSTRACT

A semiconductor integrated circuit device includes basic semiconductor elements arranged regularly in lines and rows and located at intersecting points of the lines and rows and wiring conductor layers arranged among the basic semiconductor elements regularly in lines and rows. In this semiconductor integrated circuit device, according to a desired logic operation, wiring conductor layers are cut or contact holes are formed on the wiring conductor layers to form wiring metal layers and connect the basic semiconductor elements to one another, so that an integrated circuit chip capable of performing the desired logic operation is obtained.

14 Claims, 9 Drawing Sheets

SEMICONDUCTOR INTEGRATED CIRCUIT DEVICE

This is a continuation of copending application Ser. No. 861,638 filed on May 7, 1986, which is a continuation of Ser. No. 780,243 filed Sept. 26, 1985 which is a continuation of Ser. No. 683,954, filed Dec. 19, 1984, which is a continuation of Ser. No. 174,139, filed July 31, 1980, each now abandoned.

BACKGROUND OF THE INVENTION (1) Field of the Invention

The present invention relates to a semiconductor integrated circuit device. More particularly, the present invention relates to an LSI semiconductor integrated circuit device including a master slice on which a large number of CMOS gate elements are arranged.

(2) Description of the Prior Art

With an increase in the complexity of integrated circuits, a tendency to produce a great variety of products in small quantities has become pronounced in the field of logic LSI circuit devices, and as means of accomodations this requirement, a gate array method and a master slice method have been developed. According to these methods, a great number of transistors are formed on a wafer in advance, that is, a master slice is formed in advance, and a wiring mask formed according to the kind of the intended circuit device is combined with the master slice to connect the transistors and form a desired circuit. Therefore, mass production is possible in the step of formation of master slices, and the period of development of LSI device circuits can be shortened and the manufacturing cost can be reduced. Furthermore, when transistors are arranged regularly, designing can be effectively performed by using an electronic computer. That is, CAD (computer aided design) is possible. Therefore, a labor saving effect can be attained, the development period is shortened and errors are prevented.

As such a master slice, the present inventors previously proposed a master slice comprising CMOS elements arranged regularly in both the longitudinal direction and the lateral direction on a semiconductor substrate (see Japanese patent application No. 158445/77). This master slice is advantageous because the degree of freedom of wiring is remarkably increased, various logic gates such as NAND and NOR gates and flipflops can be prepared from this master slice, and the degree of integration can be enhanced.

A diffusion layer, a polycrystalline silicon film, or a wiring film of a metal such as aluminum are used for wiring in MOS LSI circuit devices. In the case of the diffusion layer wiring, a high impurity concentration layer is formed on a semiconductor substrate by diffusion and the low resistivity diffusion layer thus formed is utilized for wiring. Therefore, the position of the diffusion layer must naturally be precisely located. Furthermore, since the capacitance between the substrate and the diffusion layer is large, this wiring is not suitable for a long distance signal line. Since a polycrystalline silicon film is often used as the gate electrode of a field effect transistor, wiring using the polycrystalline silicon film is suitable when wiring is desired on an extension of the gate electrode or at a part of the gate electrode where simultaneous formation of an electrode gate and the wiring layer is possible. Wiring using a metal film, especially an aluminum film, is most frequently adopted because of a low resistivity thereof. However, this metal film readily reacts with a silicon dioxide layer which is often used as an insulating base layer, and especially when the latter is thin, insulation becomes insufficient and the resistivity of the aluminum layer per se is increased. Moreover, a high temperature heat treatment is not permissible in a case of the metal film, because the film incurs breaks while in a molten state at a high temperature. In the case of multi-layer wiring (i.e. where wiring layers are arranged as if to intersect each other and, even if they do not intersect each other, as in the case of grid wiring, longitudinal lines and lateral lines are independently laid out in a first layer and a second layer, respectively), there is adopted a method in which polycrystalline silicon is used for a first base layer and aluminum is used for a second base layer located above the first base layer. In this case, of course, the resistivity of polycrystalline silicon is higher than that of aluminum. Incidentally, in the case of multi-layer wiring, the number of layers is oridinarily two or three, and if the number of layers is increased, the base surface becomes irregular and convexities and concavities on the base become so large that breaking of lines is easily caused.

SUMMARY OF THE INVENTION

It is a primary object of the present invention to provide a semiconductor integrated circuit device in which, simultaneously with the formation of a diffusion layer or polycrystalline silicon layer of a included in semiconductor element formed on a substrate, a common wiring pattern of the same diffusion layer or polycrystalline silicon layer is also formed as a first layer of wiring on the substrate, whereby the number of wiring layers is increased by one without changing the evenness of the base.

Another object of the present invention is to provide a semiconductor integrated circuit in which a common wiring pattern formed among semiconductor elements formed on a substrate is cut, or in which the semiconductor elements are connected to one another by a wiring metal layer, so that the desired logic operation can be performed.

In accordance with the present invention, there is provided a semiconductor integrated circuit device comprising basic semiconductor elements arranged regularly in lines and rows and located at intersecting points of the lines and rows and wiring conductor layers arranged regularly among the basic semiconductor elements in lines and rows, wherein according to the desired logic operation, the wiring conductor layers are cut or contact holes are formed on the wiring conductor layers to form wiring metal layers and connect the basic semiconductor elements to one another, so that an integrated circuit chip capable of performing the desired logic operation is obtained.

Further features and advantages of the present invention will be apparent from the ensuring description with reference to the drawings to which, however, the scope of the invention is in no way limited.

DESCRIPTION OF THE PREFERRED EMBODIMENTS

Figure 1:
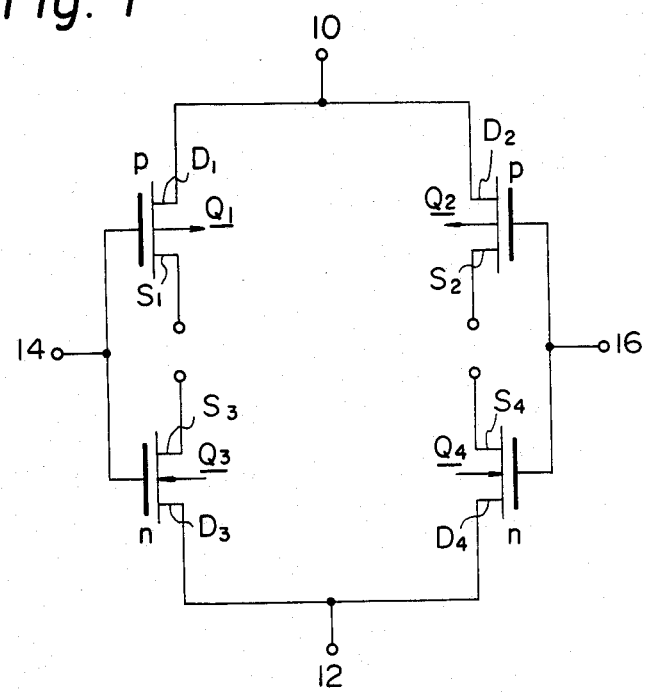
FIG. 1 is a circuit diagram of a basic semiconductor element that is used in the device of the present invention.
Figure 2:
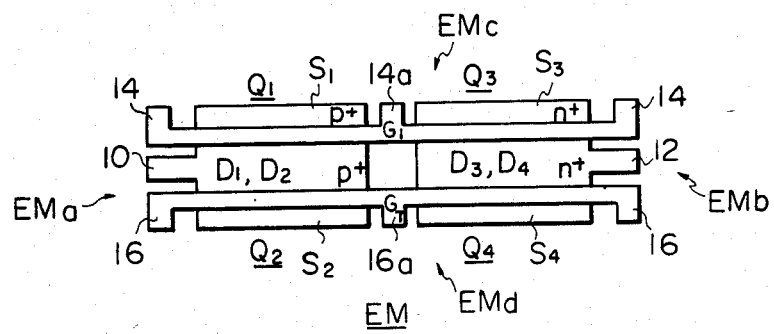
FIG. 2 is a diagram illustrating a plan view of the basic semiconductor element illustrated in FIG. 1.

Referring to FIG. 1, which shows a CMOS element used as a basic semiconductor element in the device of the present invention, $Q_1$ and $Q_2$ each represent a p-channel MOS field effect transistor, and $Q_3$ and $Q_4$ each represent an n-channel MOS field effect transistor. As illustrated in FIG. 2, drain regions $D_1$ and $D_2$ of the transistors $Q_1$ and $Q_2$ have one p+-diffusion layer in common, and a terminal 10 is connected to this diffusion layer. Also the drain regions $D_3$ and $D_4$ of the transistors $Q_3$ and $Q_4$ have one n+-diffusion layer in common as illustrated in FIG. 2, and a terminal 12 is connected to this diffusion layer. $S_1$ and $S_2$ represent p+-source regions of the transistors $Q_1$ and $Q_2$, respectively, and $S_3$ and $S_4$ represent n+-source regions of the transistors $Q_3$ and $Q_4$, respectively. Gates of the transistors $Q_1$ and $Q_3$ and of the transistors $Q_2$ and $Q_4$ are constructed by common gate electrodes $G_1$ and $G_2$, respectively, and terminals 14 and 16 are connected to these common gate electrodes $G_1$ and $G_2$, respectively. Channels CH are formed in semiconductor layers (n-type layer for $Q_1$ and $Q_2$ and p-type for $Q_3$ and $Q_4$) below these gate electrodes $G_1$ and $G_2$. Although the source regions $S_1$, $S_2$, $S_3$ and $S_4$ of the respective transistors are not connected in the drawings, if the source regions $S_1$ and $S_2$ are connected to the source regions $S_3$ and $S_4$, respectively and the contact points are used as output terminals, two known CMOS inverters connected in parallel are constructed.

A pattern of a wiring layer will now be described. If the above-mentioned diffusion layer is utilized for a wiring pattern, since the diffusion layer is formed within a semiconductor substrate, it is known as a so-called zero layer. Accordingly, if the diffusion layer is utilized for a wiring pattern, a first layer becomes a second layer and a second layer becomes a third layer. In other words, the number of wiring layers is increased by one without changing the evenness of the base, and this arrangement is advantageous in this point. However, if an ordinary semiconductor substrate such as mentioned above is used, since stray capacitance is increased, utilization of this arrangement as a long distance signal line is impossible.

However, the circumstances are quite different in a case of a semiconductor device having a silicon-on-sapphire (SOS) structure. More specifically, a diffusion layer formed in a silicon epitaxial growth layer formed on a sapphire substrate has a much smaller stray capacitance than that of a diffusion layer formed on a silicon bulk substrate, and the device can be used as a signal line. Furthermore, the diffusion layer of the SOS element is characterized in, since the etching solution for a silicon epitaxial layer is different from the etching solution for a sapphire substrate, the diffusion layer can easily be cut. When the diffusion layer is used as the wiring material of a master slice, since a wiring pattern is not determined at the time of formation of the diffusion layer (i.e. it has not yet been decided what circuit structure will be given to LSI), and since formation of the diffusion layer is possible only at a step of forming a transistor or the like on a substrate and is impossible at a subsequent step, the property of being easily cut is a very important characteristic for the wiring material.

Therefore, an embodiment in which a semiconductor substrate having an SOS structure is used will now be described in detail.

Figure 3:
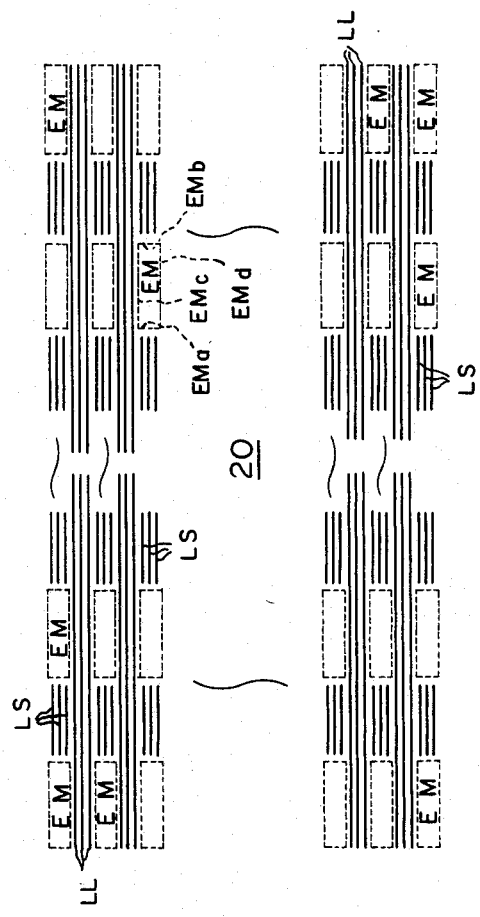
FIG. 3 is a top plan view illustrating diagrammatically a master slice used for the device of the present invention.

FIG. 3 is a master slice according to the embodiment having an SOS structure, in which basic semiconductor elements EM are arranged at predetermined intervals regularly in lines and rows on a sapphire substrate (not labelled in FIG. 3) and diffusion wiring patterns LS and LL are formed among the elements EM. As illustrated in FIG. 2, gate and drain terminals 14, 16, 10 and 12 of the elements EM are formed on both ends of the element EM in a lateral direction, and only gate intermediate terminals 14a and 16a are formed on both ends of the element EM in the longitudinal direction. In the embodiment illustrated in FIG. 3, terminal gathering ends EMa and EMb of the basic semiconductor elements EM are arranged in lines, and terminal non-gathering edges EMc and EMd of the basic semiconductor elements EM are arranged in rows. Several (3 in the present embodiment) short diffusion wiring patterns LS are formed in a region between the confronting terminal gathering edges EMa and EMb of adjacent elements EM, and the same number of long diffusion wiring patterns LL are formed in each region between the confronting terminal non-gathering ends EMc and EMd of adjacent elements EM, so that the wiring patterns LL extend along the entire length of the elements EM. The length of the diffusion wiring pattern LS is such that ten or more aluminum wiring lines may be laid out across one pattern LS. The length of the basic semiconductor element EM in a line direction is such that aluminum wiring lines for sources and drains and aluminum wiring lines necessary for connecting the elements EM to form a desired logic circuit can be formed.

Figure 4:
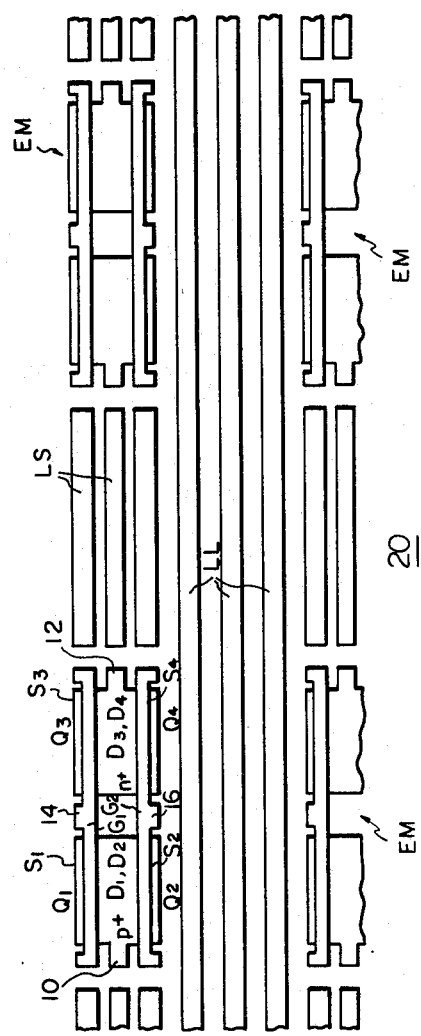
FIG. 4 is an enlarged view illustrating main parts of the master slice shown in FIG. 3.

FIG. 4 is an enlarged view of the elements of the master slice in FIG. 3. Both the wiring patterns LS and LL extend parallel to each other in the line direction. It is preferred that the number of the patterns LS between two adjacent elements be two through five, and that number of the patterns LL between two adjacent elements be two or three. The wiring pitch of the patterns LS is made larger than the wiring pitch of the patterns LL. The short diffusion layers LS are mainly used for connecting input and output terminals of the elements to input and output lines, and this connection can be accomplished by bridging an input or output terminal of an element to an end of the wiring pattern LS with a short aluminum layer. The long diffusion layers LL are used for connecting elements separated from each other, or as power source lines. Of course, lines and rows indicating the directions of formation of these patterns may be interchanged.

Figure 5:
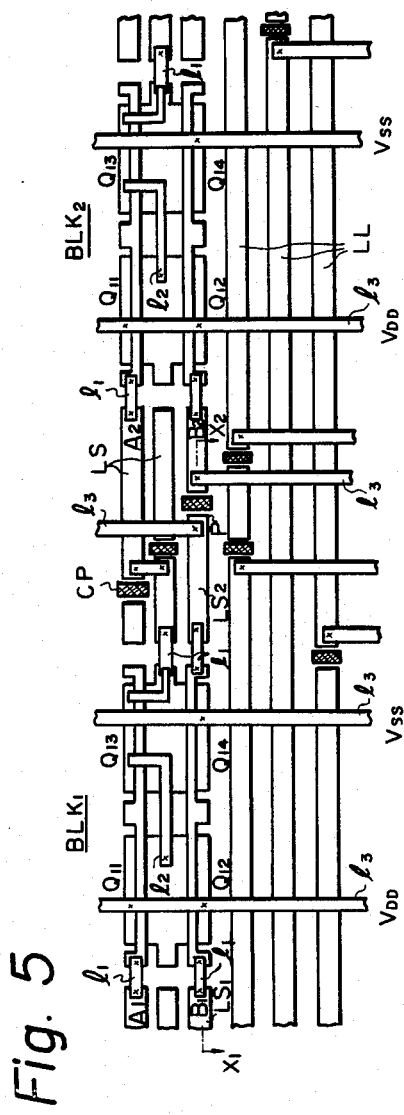
FIG. 5 is a diagram illustrating a plan view of basic semiconductor elements of the device of the present invention in an embodiment where the device is applied to a 2-input NAND gate. Symbol "x" shows the locations where a contact hole exists.
Figure 6B:
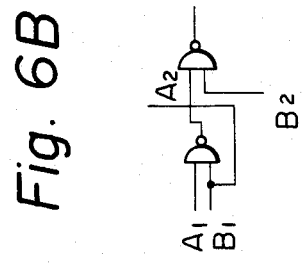
FIGS. 6A and 6B are diagrams illustrating equivalent circuits of the plan view shown in FIG. 5.
Figure 6A:
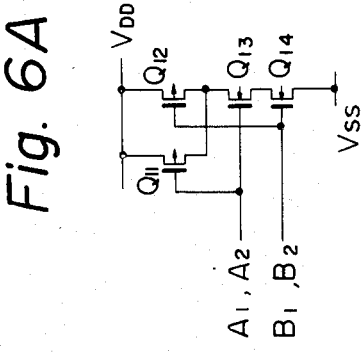

By using the above-mentioned master slice, various logic gates of basic circuits can be formed, such as AND, OR, NAND and NOR circuits and modified circuits such as two-input type circuits and three-input type circuits, and various flip-flops such as RS, D, T and J-K flipflops. By way of example, a NAND gate including the above master slice is illustrated in FIG. 5. Blocks $BLK_1$ and $BLK_2$ in FIG. 5 are two-input NAND gates as illustrated in the circuit diagram of FIG. 6A, and the entire circuit structure is illustrated in FIG. 6B. Input signals $A_1$, $A_2$, $B_1$ and $B_2$, power sources $V_{DD}$ and $V_{SS}$ and transistors $Q_{11}$, $Q_{12}$, $Q_{13}$ and $Q_{14}$ are arranged and connected as illustrated in FIG. 5. In FIG. 5, $l_1$ represents a bridge for connecting the end of the short diffusion wiring pattern LS to the input or output end of the element, and $l_2$ represents an L-shaped wiring for connecting a source or drain of one CMOS inverter to a drain or source another CMOS inverter. Furthermore, $l_3$ represents a wiring extending in a row direction acting as a line connected to the power source $V_{DD}$ or $V_{SS}$. Each bridge $l_1$, $l_2$ and $l_3$ is formed of aluminum. CP represents a pattern cut for cutting the wiring pattern LS or LL into two, three or more portions so that the respective portions act as independent signal lines. The marks X indicate contact holes between the diffusion layer and aluminum wiring.

As can be understood from FIG. 5, the diffusion wiring patterns LS and LL are cut and then used in the cut state. Accordingly, one diffusion pattern can be used as a plurality of signal lines, and wiring channels can be utilized more effectively than in a diffusion line-buried type master slice where the diffusion layer is not cut, and therefore diminished chip size can be attained. The diffusion wiring pattern is formed by ion implantation of an n-type impurity such as arsenic (As) into a silicon layer on a sapphire substrate 20. Insulation of the wiring patterns LS and LL from the surrounding portions is accomplished by (a) a method in which they are separated from surrounding portions by ethcing; (b) a method in which surrounding portions are formed of an insulating material such as silicon dioxide; or (c) a method in which pn junctions are formed. When an $n^+$-type diffusion layer is used as the wiring pattern, the value of the resistance is several times lower than in the case of a $p^+$-type diffusion layer.

Figure 7A:
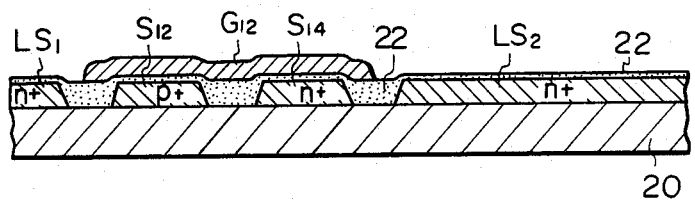
FIGS. 7A, 7B, 7C and 7D are diagrams illustrating a step of cutting a diffusion layer wiring pattern in the plan view shown in FIG. 5.
Figure 7B:
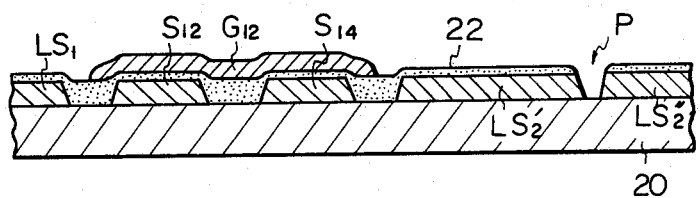
Figure 7C:
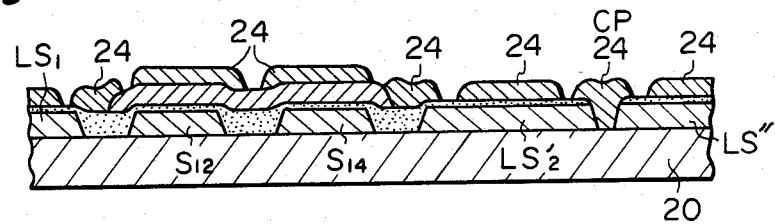
Figure 7D:
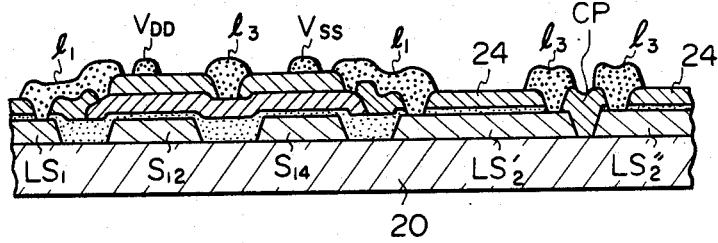
Figure 8A:
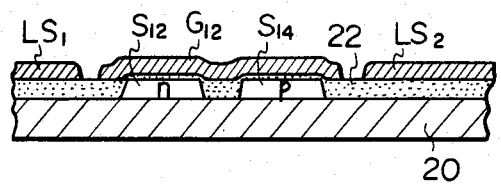
FIGS. 8A, 8B, 8C and 8D are diagrams illustrating a step of cutting a wiring pattern in an embodiment of the device of the present invention in which polycrystalline silicon layers of basic semiconductor elements are used for a wiring pattern.
Figure 8B:
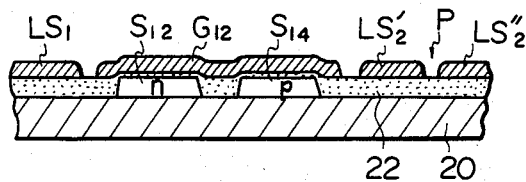
Figure 8C:
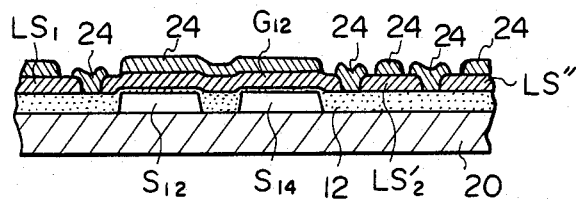
Figure 8D:
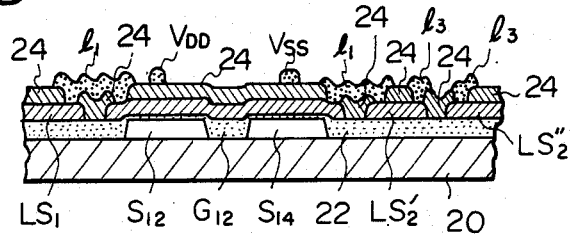

A step of cutting diffusion wiring patterns will now be described with reference to FIGS. 7A, 7B, 7C and 7D. FIG. 7A is a view illustrating a section taken along line $X_1$–$X_2$ in FIG. 5, which illustrates the state of the master slice before cutting. In FIG. 7A, there are illustrated a diffusion wiring pattern $LS_1$, a source region $S_{12}$ of a transistor $Q_{12}$ (shown in FIG. 6A), a source region $S_{14}$ of a transistor $Q_{14}$ (shown in FIG. 6A), a diffusion wiring pattern $LS_2$ and a gate electrode $G_{12}$. Reference numeral 20 represents a sapphire substrate and reference numeral 22 represents a silicon dioxide layer insulating the surface and respective regions. As illustrated in FIG. 7B, cutting of the diffusion wiring pattern $LS_2$ at a point P is accomplished by etching the surface $SiO_2$ layer 22, further etching the diffusion wiring pattern $LS_2$ below the $SiO_2$ layer 22, and dividing the pattern $LS_2$ into independent $LS'_2$ and $LS''_2$ patterns. At this stage, the pattern $LS_2$ is in an as-obtained state after ion implantation of an n-type impurity thereinto in the form of a band into a silicon epitaxial growth layer. Accordingly, since etching is carried out before annealing, many lattice defects are present and hence, the etching speed is very high, and therefore, the time required for etching can be shortened. After this cutting step, annealing is effected and the pattern $LS_2$ is covered with a PSG film 24 (FIG. 7C). Then, etching is carried out and a window is opened in a portion where the pattern $LS_2$ is to make contact with an aluminum film to be superimposed thereon. This state is illustrated in FIG. 7C. Then, by using a similar mask, aluminum is metalized to form wirings $l_1$, $l_3$, $V_{DD}$ and $V_{SS}$ as illustrated in FIG. 7D. Aluminum is used as wiring lines in the wiring channel in longitudinal direction (portion LL), lines connecting output terminals of the respective elements, wiring lines on the elements EM (especially, unused elements) and power source lines. As will be apparent from the sectional views of FIGS. 7A through 7D, in the SOS device, a p+ or n-well is not necessary even for a CMOS, and source and drain regions of a p-channel and n-channel elements can be directly formed by doping with p and n-type impurities while the channel elements are insulated by $SiO_2$ or the like. This feature is advantageous from the viewpoints of reduction of stray capacitance and prevention of formation of pnpn hook elements.

An embodiment where the diffusion layer which is formed on a sapphire substrate simultaneously with formation of the diffusion layer of a basic semiconductor element (i.e. a CMOS element) is used as a wiring pattern has been described above. Of course, in the present invention, a polycrystalline silicon layer which is formed simultaneously with formation of a gate electrode of a CMOS element can also be used as a wiring pattern. A cutting step in an embodiment where such a polycrystalline layer is used as the wiring pattern is shown in FIGS. 8A, 8B, 8C and 8D. In FIGS. 8A through 8D, the same reference numerals and symbols as used in FIGS. 7A through 7D represent parts and elements corresponding to those in FIGS. 7A through 7D. The main difference of the embodiment shown in FIGS. 8A through 8D from the embodiment shown in FIGS. 7A through 7D resides in that wiring patterns $LS_1$ and $LS_2$ are formed simultaneously with the formation of a polycrystalline silicon layer to be used as the gate electrode $G_{12}$. Cutting of the wiring patterns $LS_1$ and $LS_2$ and connection to lines $l_1$, $l_3$, $V_{DD}$ and $V_{SS}$ can be carried out in the same manner as in a case of the diffusion layer patterns described above with reference to FIGS. 7A through 7D. Therefore, a detailed description is omitted here.

Figure 9A:
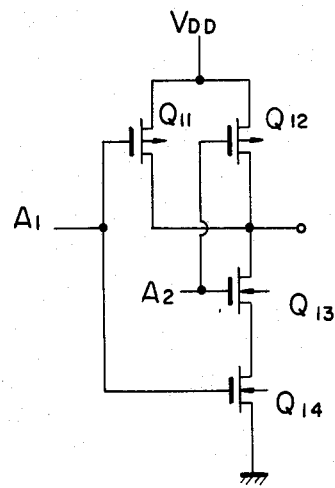
FIGS. 9A, 9B and 9C are diagrams illustrating a circuit of a two-input NAND gate, a symbol thereof and a plan view thereof, respectively.
Figure 9B:
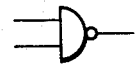
Figure 9C:
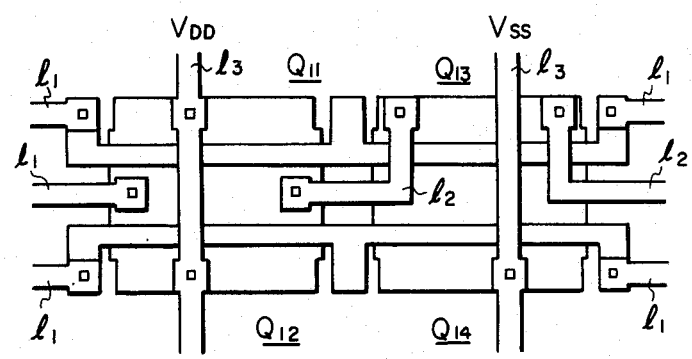

A circuit, symbol and wiring pattern of a two-input NAND gate are collectively shown in FIGS. 9A, 9B and 9C. The reference numerals and symbols represent parts and elements corresponding to those in FIGS. 5 and 6.

Figure 10A:
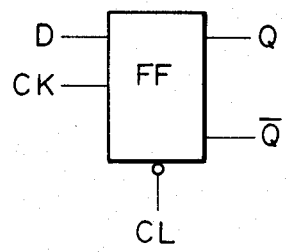
FIGS. 10A, 10B and 10C are diagrams illustrating a symbol representing a flip-flop, a circuit thereof and a plan view thereof, respectively.
Figure 10B:
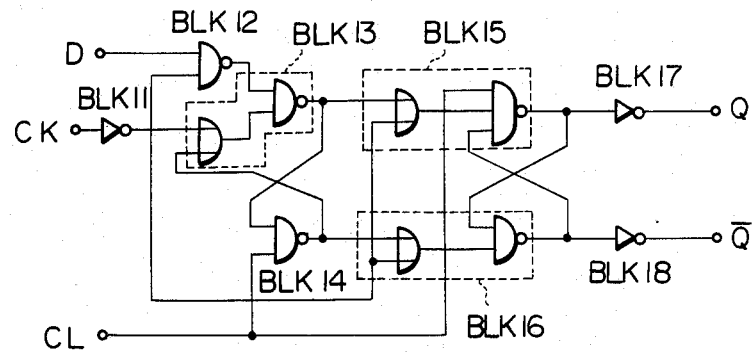
Figure 10C:
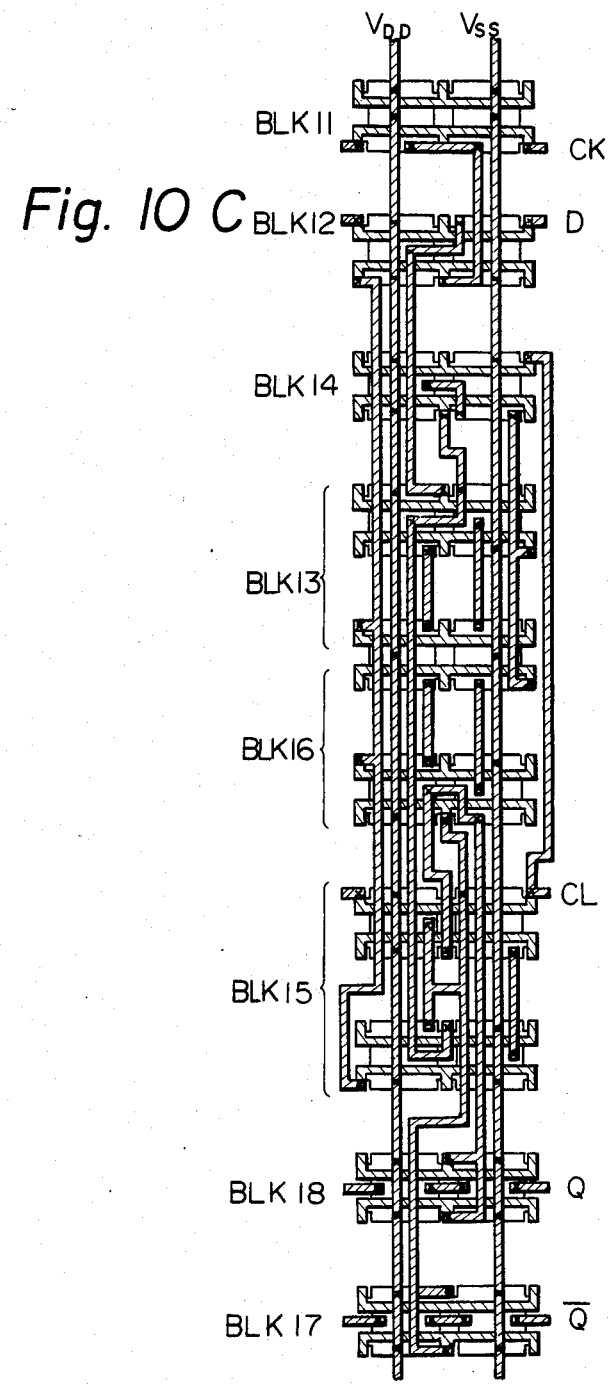

A symbol mark, circuit and wiring pattern of the a flip-flop are shown in FIGS. 10A, 10B and 10C for reference. The blocks $BLK_{11}$ through $BLK_{18}$ forming flip-flops, and plan patterns thereof, are apparent from FIGS. 10B and 10C. In FIG. 10C, only aluminum lines are indicated by thick lines, and connecting lines in each block are not shown.

When a basic semiconductor element of the present invention is used, any number of different types of logic functional cells (multi-input NAND and NOR gates, flip-flops and the like) can be prepared by appropriately adding aluminum wiring lines and cutting diffusion wiring patterns. Wiring patterns for respective logic functions are stored in a file. Three mask data, that is, data for a mask for cutting diffusion wiring patterns, a contact hole pattern mask, and an aluminum wiring mask, are automatically designed and prepared based on the data stored in the file by an electronic computer. Masks are formed based on the data, and by using the masks thus formed, a line connection is created in the basic semiconductor element according to the present invention, whereby a LSI having a desired logic function can be obtained. The following advantages can be attained according to the present invention.

(1) Since the capacitance of a diffusion wiring pattern on a sapphire substrate is smaller than the capacitance of a diffusion wiring pattern in a silicon substrate, a high speed operation becomes possible, and an LSI of one metal layer can be realized by using this diffusion wiring pattern positively as the wiring line.

(2) Since an LSI of a desired logic can be formed simply by cutting diffusion and patterns forming contact holes and wiring metal patterns on a master slice, the number of steps necessary for forming a desired LSI can be reduced as compared with the number of steps required in a master slice including two metal layers.

(3) Since an optional number of signal lines can be formed by cutting the diffusion wiring pattern, it becomes possible to utilize wiring channels effectively.

(4) Since the substrate is formed of sapphire, cutting of duffusion wiring patterns can be accomplished very easily. Not only an etching method but also a method using laser or electron beams can be used for cutting diffusion pattern layers. In each of these cases, since the surface silicon layer has a different cutting rate than the sapphire substrate, cutting is stopped at the surface of the sapphire substrate, and maintenance and control of the cutting step can be facilitated.

(5) Since the master slice used in the present invention is a CMOS master slice having a SOS structure, p-wells and channel cuts necessary for an ordinary bulk CMOS master slice need not be formed, and a highly integrated MIS device having a diminished chip size can be advantageously obtained.

The foregoing example has been explained with reference to embodiments of a semiconductor substrate having a SOS structure, but from the foregoing description, it will be apparent to those skilled in the art that the present invention can similarly be applied to a case where an ordinary semiconductor substrate is used.

What is claimed is:
1. A CMOS master slice array, comprising:
a plurality of CMOS elements disposed in columns and rows;
a plurality of first wiring patterns having a first length, disposed in parallel between adjacent ones of said CMOS elements within respective ones of said columns of said CMOS elements;
a plurality of second wiring patterns having a second length, the second length being longer than the first length, disposed in parallel between adjacent ones of said columns of said CMOS elements and extending in a direction parallel to the columns;
an insulating layer formed on said CMOS elements, said second wiring patterns, and said first wiring patterns, said insulating layer having a plurality of holes formed therein, and disposed above selected areas of said CMOS elements and said first and second wiring patterns; and
a plurality of aluminum lines, selectively disposed above said plurality of holes and said insulating layer so as to provide desired electrical connections between the selected areas of said CMOS elements.

2. A CMOS master slice array according to claim 1, wherein said first and second wiring patterns are selectively cut, so that said CMOS elements, said first and second wiring patterns, and said aluminum lines form a desired circuit element.

3. A CMOS master slice array according to claim 2, wherein the number of said second wiring patterns disposed in parallel between adjacent ones of said columns of said CMOS elements is selected from the range of two to three.

4. A CMOS master slice array according to claim 3, wherein the number of said first wiring patterns disposed between adjacent ones of said CMOS elements within one of said columns of said CMOS elements is selected from the range of two to five inclusive.

5. A CMOS master slice array according to claim 4, wherein each of said CMOS elements comprise:
a p-type diffusion area;
an n-type diffusion area;
two first and second channel regions, one of said first and one of said second regions being formed across said p-type and n-type diffusion area;
a first gate area, formed above said first channel regions and between said p-type and said n-type diffusion areas; and
a second gate area, formed above said second channel regions and between said p-type diffusion area and said n-type diffusion area.

6. A CMOS master slice array according to claim 5, wherein said CMOS elements comprise silicon-on-sapphire devices.

7. A CMOS master slice array according to claim 6, wherein three of said second wiring patterns are disposed in parallel between said adjacent columns and extend along the length of said CMOS elements, and wherein three of said first wiring patterns are disposed in parallel, between adjacent ones of said CMOS elements, within one of said columns.

8. A CMOS master slice array according to claim 7, wherein the total length of each of said first wiring patterns is more than 10 times the width of one of said aluminum lines.

9. A CMOS master slice array according to claim 1, wherein said first and second patterns comprise polysilicon.

10. A CMOS master slice array according to claim 9, wherein said first and second gate areas of said CMOS elements comprise polysilicon.

11. A CMOS masterslice array according to claim 2, wherein said first and second patterns comprise polysilicon.

12. A CMOS masterslice array according to claim 4, wherein said first and second patterns comprise polysilicon.

13. A CMOS masterslice array according to claim 5, wherein said first and second patterns comprise polysilicon.

14. A CMOS masterslice array according to claim 8, wherein said first and second patterns comprise polysilicon.

* * * * *

UNITED STATES PATENT AND TRADEMARK OFFICE
CERTIFICATE OF CORRECTION

PATENT NO. : 4,791,474
DATED : DECEMBER 13, 1988
INVENTOR(S) : YOSHIHIDE SUGIURA ET AL.

It is certified that error appears in the above-identified patent and that said Letters Patent is hereby corrected as shown below:

Col. 2, line 30, delete "included in";

line 59, "ensuring" should be --ensuing--.

Col. 4, line 12, after "in" insert --that--;

line 62, after "that" insert --the--.

Signed and Sealed this

Eighteenth Day of April, 1989

Attest:

DONALD J. QUIGG

Attesting Officer

Commissioner of Patents and Trademarks